(12) United States Patent
Villaret et al.

(10) Patent No.: US 10,876,864 B2
(45) Date of Patent: Dec. 29, 2020

(54) HIGH RESOLUTION ABSOLUTE ENCODER

(71) Applicant: Servosense (SMC) Ltd., Petach-Tikva (IL)

(72) Inventors: Yves Villaret, Hadera (IL); Alexander Puzev, Bnei-Brak (IL)

(73) Assignee: Servosense (SMC) Ltd., Petadh-Tikva (IL)

( * ) Notice: Subject to any disclaimer, the term of this patent is extended or adjusted under 35 U.S.C. 154(b) by 55 days.

(21) Appl. No.: 16/328,732

(22) PCT Filed: Jul. 31, 2017

(86) PCT No.: PCT/IL2017/050846
§ 371 (c)(1),
(2) Date: Feb. 27, 2019

(87) PCT Pub. No.: WO2018/025261
PCT Pub. Date: Feb. 8, 2018

(65) Prior Publication Data
US 2019/0195660 A1 Jun. 27, 2019

Related U.S. Application Data

(60) Provisional application No. 62/369,761, filed on Aug. 2, 2016.

(51) Int. Cl.
*G01D 5/249* (2006.01)
*H03M 7/16* (2006.01)
(Continued)

(52) U.S. Cl.
CPC ......... *G01D 5/2497* (2013.01); *G01D 5/145* (2013.01); *G01D 5/24476* (2013.01); *H03M 7/16* (2013.01)

(58) Field of Classification Search
CPC ............... G01R 35/005; G01R 31/3675; G01R 31/362; H02J 7/0063; H02J 2007/0067;
(Continued)

(56) References Cited

U.S. PATENT DOCUMENTS 6,479,987 B1 * 11/2002 Marx ............... G01B 7/30
324/207.12
6,617,972 B2 * 9/2003 Takarada .......... G08B 21/0484
340/635

(Continued)

FOREIGN PATENT DOCUMENTS

CN 1871500 11/2006
CN 201348929 11/2009
(Continued)

OTHER PUBLICATIONS

Supplementary European Search Report and the European Search Opinion dated Feb. 11, 2020 From the European Patent Office Re. Application No. 17836520.1. (8 Pages).
(Continued)

*Primary Examiner* — Giovanni Astacio-Oquendo

(57) ABSTRACT

A high resolution encoder device using a number of static sensors distributed on a circumference, and a rotating disc, having several sections of two different properties on an annular track according to a predefined pattern, placed so that the sensors can sense the properties of the sections of track in proximity. An auxiliary unit is also provided and by itself or in combination with the sensor signal values, provides a first low resolution position value. In a first processing step, the signals of each sensor are compared to a threshold, and bit values zero or one for each sensor are set according to the comparison result. All bits are then set in a digital word, in order to create a code number, which in combination with the output of the auxiliary unit, is characteristic of a first low resolution position value. For each
(Continued)

low resolution position value, a mathematical combination of signals values is defined. The values of the result of said mathematical combination of the signals value is then used as an entry variable to pre-recorded tables to output high resolution position value.

10 Claims, 8 Drawing Sheets

(51) Int. Cl.
*G01D 5/14* (2006.01)
*G01D 5/244* (2006.01)

(58) Field of Classification Search
CPC .. G01D 5/2497; G01D 5/145; G01D 5/24476; H03M 7/16
USPC .......................................... 324/431, 426, 425
See application file for complete search history.

(56) References Cited

U.S. PATENT DOCUMENTS

| | | | | |
|---|---|---|---|---|
| 8,779,729 | B2* | 7/2014 | Shiraishi | G06F 1/3212 320/155 |
| 2002/0067162 | A1* | 6/2002 | Dammkohler | F02D 11/106 324/207.21 |
| 2010/0140463 | A1 | 6/2010 | Villaret | |
| 2010/0253327 | A1 | 10/2010 | Villaret | |
| 2012/0098518 | A1* | 4/2012 | Unagami | G01R 22/066 324/74 |
| 2014/0210479 | A1* | 7/2014 | Rink | G01R 1/203 324/426 |
| 2015/0070001 | A1 | 3/2015 | Villaret | |

FOREIGN PATENT DOCUMENTS

| | | |
|---|---|---|
| CN | 104159685 | 11/2014 |
| CN | 105492869 | 4/2016 |
| DE | 10058623 | 6/2002 |
| EP | 0973013 | 1/2000 |
| JP | 09-014903 | 1/1997 |
| WO | WO 2018/025261 | 2/2018 |

OTHER PUBLICATIONS

International Preliminary Report on Patentability dated Jul. 11, 2018 From the International Preliminary Examining Authority Re. Application No. PCT/IL2017/050846. (15 Pages).
International Search Report and the Written Opinion dated Nov. 17, 2017 From the International Searching Authority Re. Application No. PCT/IL2017/050846. (7 Pages).
Notification of Office Action and Search Report dated Jun. 16, 2020 From the China National intellectual Property Administration Re. Application No. 201780053847.8 and Its Translation Into English. (12 Pages).

* cited by examiner

HIGH RESOLUTION ABSOLUTE ENCODER

FIELD OF THE INVENTION

The present invention relates to encoder devices (encoders).

BACKGROUND OF THE INVENTION

Encoders are used to measure the angular position of a rotating element, or the relative displacement of sliding elements; they are typically used in control systems, often referred as servo systems, where a motion controller is used to make a moving element to follow a precise desired path. For that purpose, encoder devices include an electronic interface which allows their connection to a motion controller.

An encoder may be of two types, rotary and linear. Rotary encoders are designed to measure the angular position of a rotary element, like the shaft of a motor or any rotating device. Linear encoders are designed to measure the relative movement of two sliding elements, for example a sliding carriage mounted on linear bearing relative to a static base.

In a common application, a rotary encoder is mounted on an electrical motor shaft at the rear end, and provides position information about the shaft rotation angle to the electric motor controller and this at a high rate. The motor controller will then output a current to the motor in order to make it rotate toward the desired position.

In another common application, a linear encoder is mounted on the moving element of a linear motor, and is connected to the linear motor motion controller.

In the scope of this patent application, the term "encoder device" is used to refer either to a rotary or to a linear encoder. A linear encoder is constructed by using the same components as a rotary encoder, and disposing these components on a linear path. The linear path is divided into a number of consecutive equal length section referred to herein as periods. In a first implementation, encoder components are disposed along one period in a similar way to the disposition of these components on a circular path. In other implementations, the components can be disposed on several periods, provided that the distance of each component from the position of the same component in the first implementation is equal to an integer number of periods.

In automatic machinery, it is often required that moving elements will follow a path with a very high precision, and at high speed. To achieve this, the encoder device must be designed with high precision, and should be able to transfer position information at a high rate. As an example, commercially available rotary encoders can provide precision better than 0.01 degree; rate of transfer of the rotation angle value to a motion controller is typically between 8,000 to 30,000 value transfers per second.

Another parameter for designing an encoder device is its resolution. The resolution represents the smallest position change that the encoder device is able to measure in one turn or in one length unit, and is usually expressed in number of position values per turn or linear distance. The smallest position change defined by the resolution is usually smaller than the precision, meaning that the encoder device is able to provide position value having more significant digits than required for the precision, even if the position value output differs from the actual position by some error, this error being inferior to that defined by the precision characteristic of the encoder. High resolution allows motion controllers, also called servo controllers, to achieve a tight and smooth control of the moving elements.

Encoder devices may be absolute or incremental. An absolute encoder device is able to measure the angular or linear position relative to a fixed reference position, while an incremental encoder device is only capable of measuring the angular or linear displacement from the start of its operation. Thus, when an incremental encoder device is used in automatic machinery, it is of common use to execute, at each start of operation of the machine, a search for a reference position. This search is done at slow speed in a given direction, until a limit switch or other device placed at the reference position is activated. This search procedure adds complexity to the system, and delays the first operation of the machine. In spite of this drawback, incremental encoders are commonly used, due to their simplicity and their low cost. In many cases, a machine builder would have preferred to use an absolute encoder, but makes use of an incremental encoder due to the higher cost of presently available absolute encoders.

It is desirable to provide an absolute encoder device, which is of simple fabrication and provide high precision and resolution at a low cost.

In Patent U.S. Pat. No. 9,007,057 by Villaret, there is described an absolute encoder device of simple construction, that can provide absolute position information with high resolution. The device makes use of a number n of analog sensors, equally distributed on a circumference, on a static part; a rotating disc, having sections of alternating properties on an annular track according to a specific pattern, is placed so that the sensors can sense the property of the section of track in proximity. During disc rotation, different sections of the rotating disc get in proximity to each sensor. Each sensor electrical signal is first digitized to provide a bit value 1 or 0; Bit values of all sensors are then combined in a digital word to create a unique code value for each rotating disc angular range position. In a second step, one of the n sensors is selected and its analog output value is used to calculate a high resolution position value.

An advantage of the above-mentioned patent is the simplicity of the device. Since sensors are equally distributed on a circular line, the distance between sensors is relatively large and commercially available sensors of normal size can be used.

The term "sectors" is defined in the above-mentioned patent as being angular portions of an encoder rotating disc circular track, all sectors being of approximately equal angular size. Each sector of the said track is made of material having a first or a second property, according to a predefined pattern.

A first requirement of the above-mentioned patent is that the code is monovalent, i.e. that a code value is obtained only on the range of one sector.

A second requirement is that the code should be a Gray code, i.e. during movement, the transition from one sector to the neighbor sector will result in the change of only one bit of the digital code. This is required in order to avoid code errors during transition.

Both above requirements can be obtained using a pattern designed according to method described in patent U.S. Pat. No. 8,492,704 by Villaret.

These two requirements result in practical implementation limitations, as explained below:

Overall achievable resolution of the encoder according to U.S. Pat. No. 9,007,057 is roughly equal to the resolution of the digital code multiplied by the resolution of the analog sensors signals.

For the purpose of increasing resolution, either a) the resolution of the analog sensor reading orb) the resolution of the digital code should be increased.

Regarding a), practical resolution of standard Analog sensors and Analog to digital converters is limited by the electrical noise. In particular, a high resolution encoder should also provide the position value within a very short time, thus requiring a high speed Analog to digital converter. Increasing resolution thus becomes very difficult and impractical.

Regarding b), increasing resolution of the digital code can be done by increasing the number of sensors and changing the pattern according to patent U.S. Pat. No. 8,492,704 by Villaret. However, when increasing the number of sensors n, the code resolution obtained becomes very inefficient, i.e. the number of codes becomes a smaller fraction of the number of possible code values $2^n$. For example, with n=7 sensors, it is possible to find practical patterns providing 98 code values. Using n=8 sensors, a practical pattern can provide only 128 code values. So while the number of sensors increases, gain in resolution is small. In another aspect, for the example of n=7 sensors, a practical pattern can be found that defines sections extending over a relative large number of sectors, so that they can be easily implemented with elements of relative large size, for example with magnets. For a higher number of sensors, sections of the pattern have much smaller size and become impractical for implementation, requiring miniature components, and for example become impractical for magnets.

For the purpose of further increasing the resolution, it is thus desired to provide an encoder device providing a higher resolution of the digital code and a higher resolution of the analog processing of the sensor signals.

Thus it is an object of the present invention to provide an encoder device able to provide high resolution including a) an auxiliary unit to provide a first low resolution position value whose resolution can be greater than $2^n$, where n is the number of sensors and b) a pattern on a moving element and a number n of static sensors to sense this pattern and c) a processing unit and method to increase the precision of the encoder. The first low resolution position value is obtained by combining the output of the auxiliary unit with a digital code calculated from the sensors analog signals.

A first advantage of this invention is that the resolution of this first position value is not limited to $2^n$, where n is the number of sensors. Since the total resolution of the encoder position output is the product of the resolution of the low resolution position value with the resolution of the analog signals, then the total resolution of the encoder is increased.

A second advantage is that electrical signals of sensors are mathematically combined to provide combined signals that are less sensitive to tolerances in the mechanical and electronic components.

It is also an object of the present invention to provide the above mentioned high resolution encoder device without the above mentioned auxiliary unit, wherein the above mentioned first low resolution position value is provided with a high resolution by processing of the analog sensors signals, and wherein this low resolution can be higher than $2^n$ where n is the number of sensors.

SUMMARY OF THE INVENTION

Accordingly, it is a principal object of the present invention to provide a high resolution encoder device having sensors preferably equally distributed on a circular line, so that commercially available sensors can be used. The new encoder device makes use of sensors providing an analog output and includes a memory and processing means in order to obtain a high absolute resolution, not limited by the number of sensors.

In a first aspect, there is provided a low resolution position value with higher resolution than $2^n$, where n is the number sensors, thus allowing a total higher resolution of the encoder. In a second aspect, the analog processing of the electrical signals increases the precision of the encoder output.

The present invention makes use of a number of static sensors preferably equally distributed on a circumference; a rotating disc, having several sections of two different properties on an annular track according to a predefined pattern, is placed so that the sensors can sense the properties of the sections of track in proximity. During disc rotation, different sections of the rotating disc are positioned in proximity to each sensor. According to this invention, the sensor signals take analog values continuously varying from a first range of values when in proximity to a rotating disc section of a first property, a second range of values when in proximity to a rotating disc section of a second property, and intermediate values when in proximity to a transition position on the rotating disc.

The present invention also includes an auxiliary unit. This unit, by itself or in combination with the sensor signal values, provides a low resolution position value. Any known prior art technology can be used to provide this low resolution position value.

Previous to first operation of the encoder, in a pre-processing step, characteristics of the encoder are calculated and measured, and stored in the encoder memory. These characteristics are in the form of tables of values and predefined codes that define the response of the sensors to the rotating disc track properties.

In a first type of embodiment, in a first processing step, the signals of each sensor are compared to a threshold, this threshold being for example the median value between the maximum and minimum values of the signals, and bit values zero or one for each sensor are set according to the comparison result. All bits are then combined in a digital word, in order to create a code number. In the scope of the present invention, a "sector" is defined as a continuous range of positions for which a given code number is obtained. The code number in itself does not provide a monovalent code, meaning that the same code may be obtained at different sectors. However this code number, in combination with the output of the auxiliary unit, is characteristic of the sector. A sector is thus identified by its code number and the output of the auxiliary unit.

In the above mentioned pre-processing step, the sector code and position have been pre-stored in memory, together with the output of the auxiliary unit. Identification of the sector then provides position information with the resolution of the sector size. This position value is further referred to herein as low resolution position value. For example, it will be shown that a pattern with 5 sensors can provides 50 sectors. Then the low resolution position value can provide position information with an approximate resolution of 1 turn/50 i.e. 7.2 degrees.

In a second type of embodiment, the auxiliary unit is a low resolution absolute encoder of any prior art and the low resolution position value is, for example, a rounded value of this encoder position output value. In these embodiments, a sector is thus defined as the range of positions for which the same low resolution position value is obtained.

In a third type of embodiment, an auxiliary unit is not used, and the low resolution position value is obtained using the digital code and further processing of the analog sensor signals.

In a second processing step of any of these embodiments, the low resolution position value is used to select a particular mathematical combination of a number of signals. The selection of the particular mathematical combination of signals for each low resolution position value have been pre-defined in the pre-processing step mentioned above. The combined signal, calculated using the particular mathematical combination defined for this low resolution position value, provides a signal with reduced relative noise and less sensible to mechanical tolerances, temperature and other factors affecting the precision of the encoder. The values of the combined signals are then used as entries to pre-recorded tables to output high resolution position value. Characteristic of this invention is that the combination of signals is pre-defined per each low resolution position value.

The encoder is thus able to output a high resolution position value, implementing the following processing steps:

1) Reading a first low resolution position value using either a) auxiliary unit, or b) both auxiliary unit and digital code, or c) digital code and further processing of the analog signals;

2) Selecting, according to the low resolution position value:
   a) the type of mathematical combination of signals to be used using pre-stored combination tables and the low resolution position value as an entry variable, and
   b) the high resolution position table to be used, using a pre-stored table of the high resolution position tables, the entry variable to this table being the low resolution position value;

3) Calculating combined signal(s) using the selected combination;

4) Using the combined signal(s) as entry(s) to the selected position tables to obtain high resolution position value(s); and 5) Providing output position value(s), or a combination of them in case of plural position values.

A characteristic of this invention is that the combination of signals is pre-defined per each low resolution position value.

For each low resolution position value, at least one analog value is calculated as a mathematical combination of the sensor signals. For each low resolution position value, predefined combinations are defined that can include multiplications, additions or any other mathematical operations between signals. These values are further referred to herein as combined signals. For each low resolution position, during the pre-processing step, a number of combined signals is associated.

In a first consideration, combination of several signals into one signal statistically reduces the signal to noise ratio.

In a second consideration, by appropriate definition of the mathematical combination, the combined signal can be made less sensitive to the influence of physical factors like variation of signal amplitude with temperature, or variations of the signal amplitude to movements of the disc center of rotation axis.

For example, a small movement of the disc center of rotation axis will result in a small eccentricity of the disc relative to sensors. Some sensors will get closer to the disc track, some other will get further from the disc track, and the sensors signal amplitude will be affected accordingly. If one sensor signal is used in the encoder processing algorithm, as described in U.S. Pat. No. 9,007,057 by Villaret, then the encoder position output precision will be directly affected by this sensor electrical signal amplitude change. However, if several sensors are used in the processing algorithm, each sensor is influenced in a different direction, and the total influence on encoder output is averaged, resulting in increased precision.

In the scope of this patent, the range of positions in which the same code, or the same low resolution position value is obtained is designed as a sector.

The particular combination of signals associated with each code is predefined according to the characteristic of the signals depending on the particular mechanical implementation and the type of sensor, with the purpose to produce a monotonous function of the shaft angle within the sector.

During the pre-processing step there is also recorded as a function of the rotating disc position, for each sector, the functions (combined signal functions) expressing the variations within the range of positions of the sector of the combined signals. Encoder sensors and rotating disc section properties are designed so that the transition from a first range of values to a second range of values of the signals extends over a range of rotating disc position equal to or larger than one sector. Accordingly, within the range of one sector, it is always possible to define a combination of signals which is monotonous with the angular disc position. Three examples of combinations are listed here, however many others are possible:

The weighted sum of all the signals that are monotonous within the sector, using positive weight if signal is growing, negative weight if signal is decreasing The arc-tangent of the ratio of two signals that are zero crossing at the two ends of the sector The arc-tangent of the ratio of two combined signals each combined signal being the weighted sum of monotonous signals in the sector.

It must be understood that many other combinations can be used.

The combined signal values are recorded, during the pre-processing step, for each position in the respective sector and stored in tables of values at high resolution, calculated by theory or simulation, or measured using a reference encoder. Thus for each sector, at least one table is defined. Optionally, a mathematical model that approximates the variations of the combined signal values with position may be found. In this case these tables will contain the parameters of the mathematical model.

In a last processing step, combined signals associated with the sector are selected, and their values are used as entries to the tables defined for this sector. These tables have been recorded in the pre-processing step with high resolution. There may be several tables defined for one sector; in that case several position values are obtained. These values may slightly differ, depending on the precision of the tables and the sensor noise. Averaging or other methods can be used to calculate a position value with optimal precision using these plural output values.

The result is thus a high resolution absolute encoder, of simple arrangement, that can provide improved resolution by use of an auxiliary unit and combinations of signals, used as entries to pre-selected position tables.

DETAILED DESCRIPTION OF THE PREFERRED EMBODIMENTS

Figure 1:
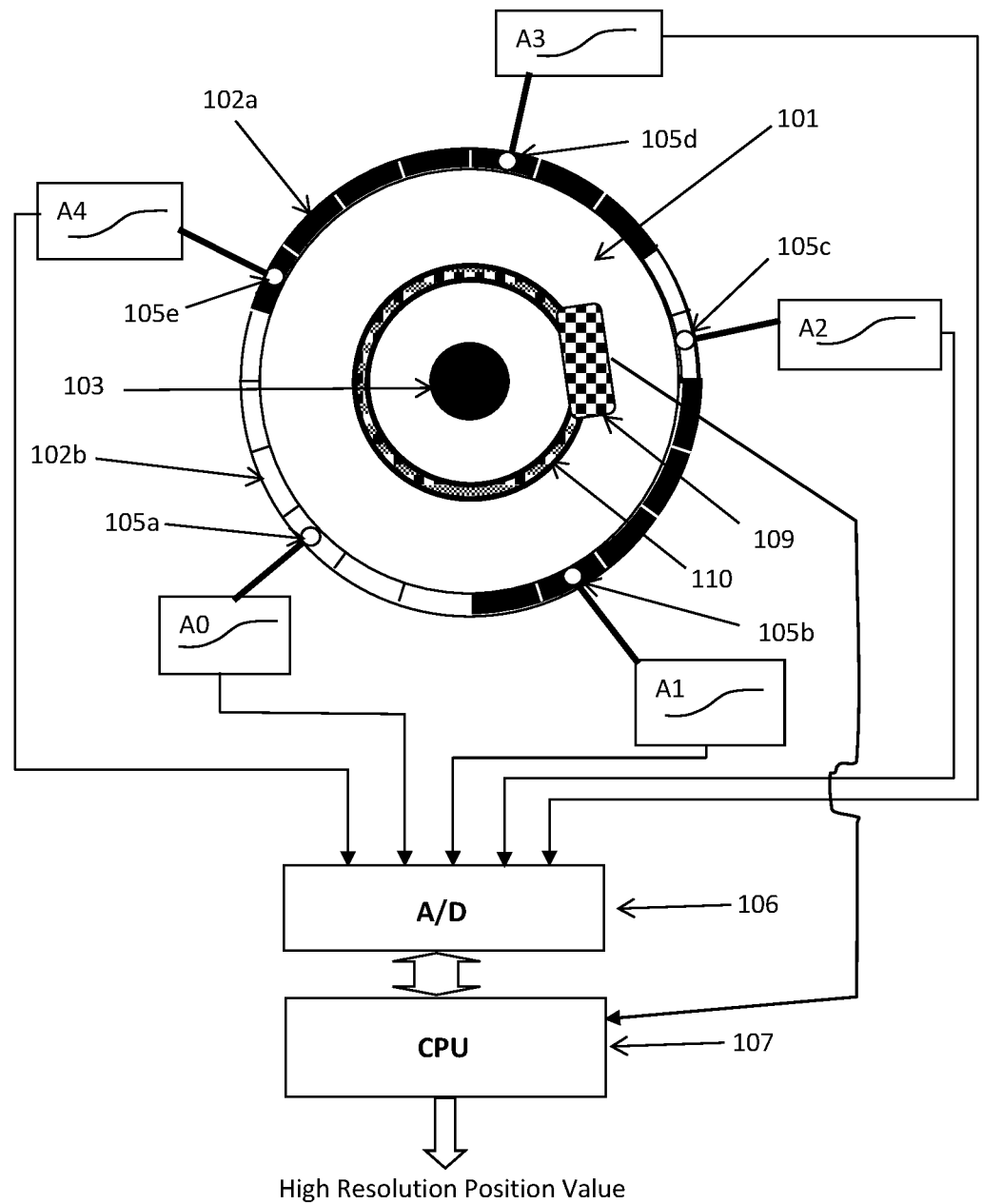
FIG. 1 shows an absolute encoder with sensors and auxiliary unit according to the present invention.

In FIG. 1 there is shown an encoder arrangement, according to the present invention. An encoder disc 101, fixed to a rotating shaft 103, includes at its outer circumference, a track with a number of sectors like 102a and 102b of different properties. Sectors like 102a filled in black color represent sectors of a first property, and sectors like 102b filled in white color represent sectors of a second property. Sensors 105a, 105b, 105c, 105d and 105e are static and placed in proximity of the track. The sensors provide output analog signals respectively A0, A1, A2, A3, A4 and A5. The output of the sensor varies from a first range of values when the sensor is in proximity to a sector of a first property like 102a, and a second range of values when the sensor is in proximity to a sector of a second property like 102b. The rotating encoder disc also includes a second track 110.

A static auxiliary unit 109, placed in proximity to the second track 110, is connected to a microcontroller (CPU) 107, and provides a low resolution position value available to the CPU 107. The second track 110 and the auxiliary unit 109 may be designed according to any prior art method. Optimally, the auxiliary unit 109 and the second track 110 will be designed to provide very low resolution for low cost considerations. The analog signals A0-A5 are input to an analog to digital converter 106 and their digital values are then input to the CPU 107. The CPU 107 also receives low resolution position value from the auxiliary unit. The CPU 107 then processes the signals values A0-A5 and the low resolution position value according the method of this invention described further herein, and outputs a high resolution position value.

Figure 2:
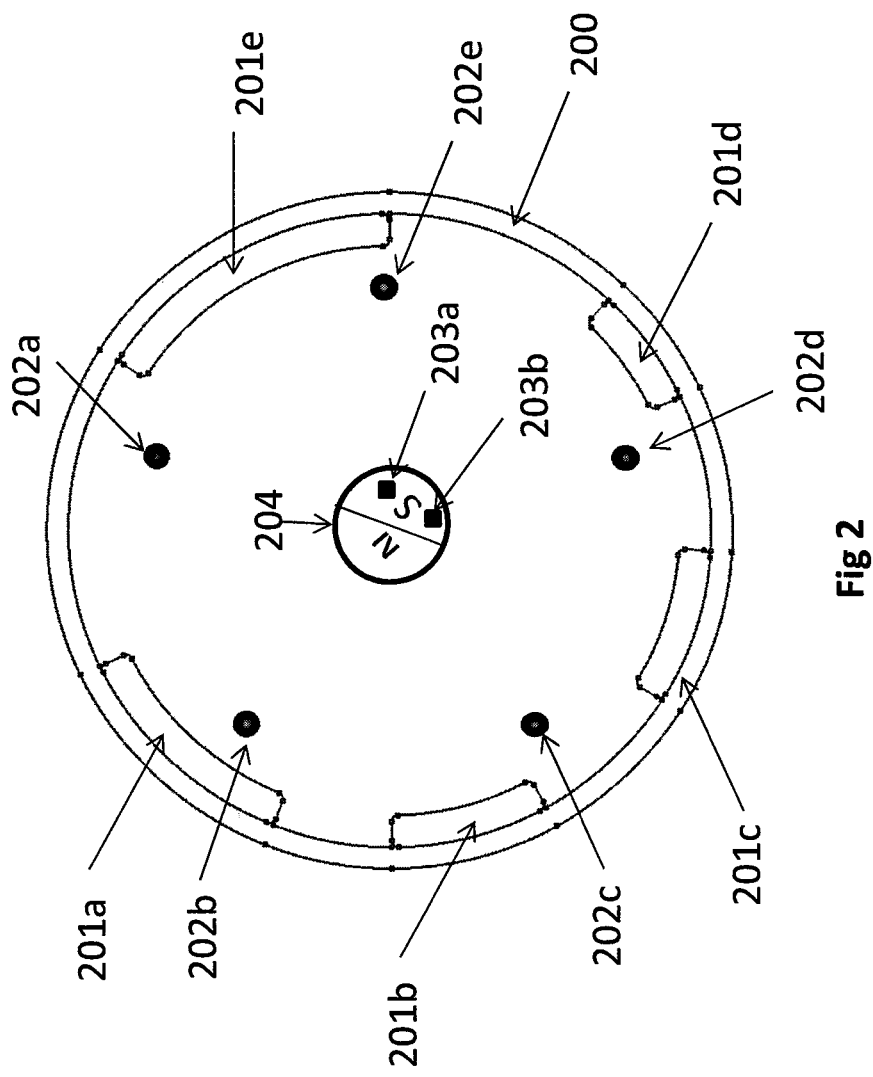
FIG. 2 shows an implementation of the encoder with a pattern of 5 magnets, 5 sensors and two digital Hall sensors.

FIG. 2 shows an example of pattern of 50 sectors that can be used with 5 sensors. The encoder disc includes an external cylindrical wall 200. Internally to this wall, 5 magnets having an arc shape 201a to 201e are affixed to form the pattern. The magnets are all magnetized radially with the same direction, for example inward. A pattern is obtained wherein sections of the internal circumference of the cylindrical wall 200 are covered with magnets (first property) or not covered with magnets (second property). According to the specific pattern shown in FIG. 2, the magnets 201a-201e cover respectively and approximately 6, 4, 4, 3 and 8 sectors, and the uncovered sections of the wall 200 circumference adjacent to magnets 201a-201e in the counter clock wise direction extend respectively and approximately over 3, 4, 4, 6 and 8 sectors. Five static Hall sensors 202a-202e are uniformly positioned on a circular line, internal and concentric with the external wall 200 and these sensors output a signal in relation with the magnetic field. Whenever there is a rotation of the disc, external wall 200 and magnets 201a-201e rotate around the sensors.

During rotation, magnet-covered sectors and magnet-uncovered sectors alternate and are positioned in proximity to the sensors, generating a variable sensor signal, which is a function of the disc rotation angle. Also shown in FIG. 2 is a circle magnet 204 fixed to the rotating disc and magnetized so that a first half circle is North pole, and the other half a South pole. Two static digital Hall sensors 203a and 203b are placed close to the magnet, are connected to the CPU and can sense which magnet pole is in proximity. These two digital Hall sensors are placed at a 90 degree angular position distance. In this embodiment, these digital Hall sensors implement the above mentioned auxiliary unit and provide position information with a $\frac{1}{4}^{th}$ of a turn resolution to the CPU according to their two possible respective states i.e. in proximity to a North or South pole. The Boolean state of these digital Hall sensors will be further referred as H1 and H2.

Figure 3:
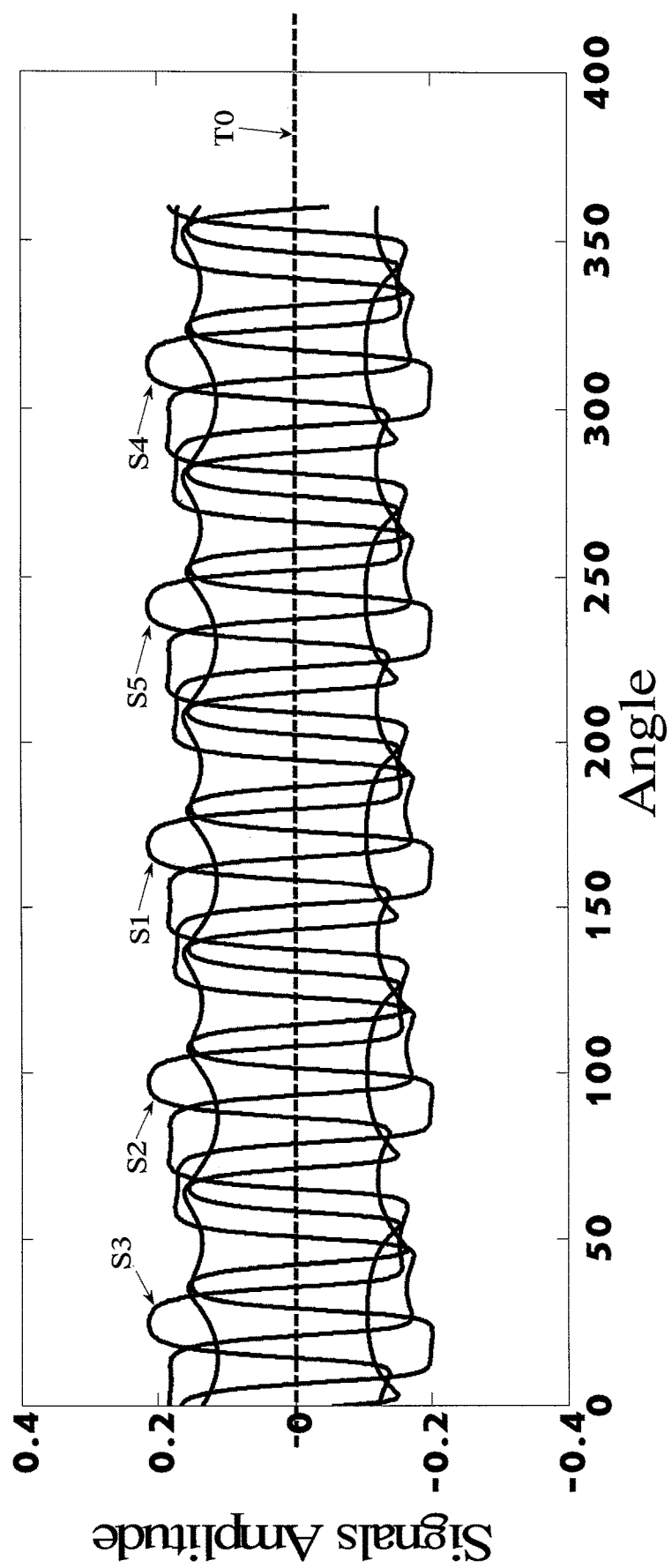
FIG. 3 shows the variations of the sensors signals for the implementation shown in FIG. 2.

FIG. 3 shows an example of the signals variations as a function of the angular rotational position of the encoder disc for the pattern of FIG. 2. The five signals S1-S4 have basically the same shape with an angular shift according to the respective sensor angular position. Apart from angular shift, signals S1-S4 may have small shape differences due to tolerances in the geometrical arrangement or in the Hall sensor characteristics. We refer here to a zero cross of signal as the position where the value of this signal crosses a threshold T0, typically close to the average value. The pattern has been designed so that zero crossings are approximately equidistant. At each position, the Boolean value 1 is associated with a signal if its value is greater than the threshold T0, and zero if smaller. Thus, five associated Boolean values are set in a five bit word, thus creating a code for this position. The number of sectors is equal to the number of zero crossings, and for the specific pattern of FIG. 2 there are 50 sectors. Since the number of codes is limited by the number of sensors (5) to $2^5=32$, then several sectors may have the same code.

Figure 4:
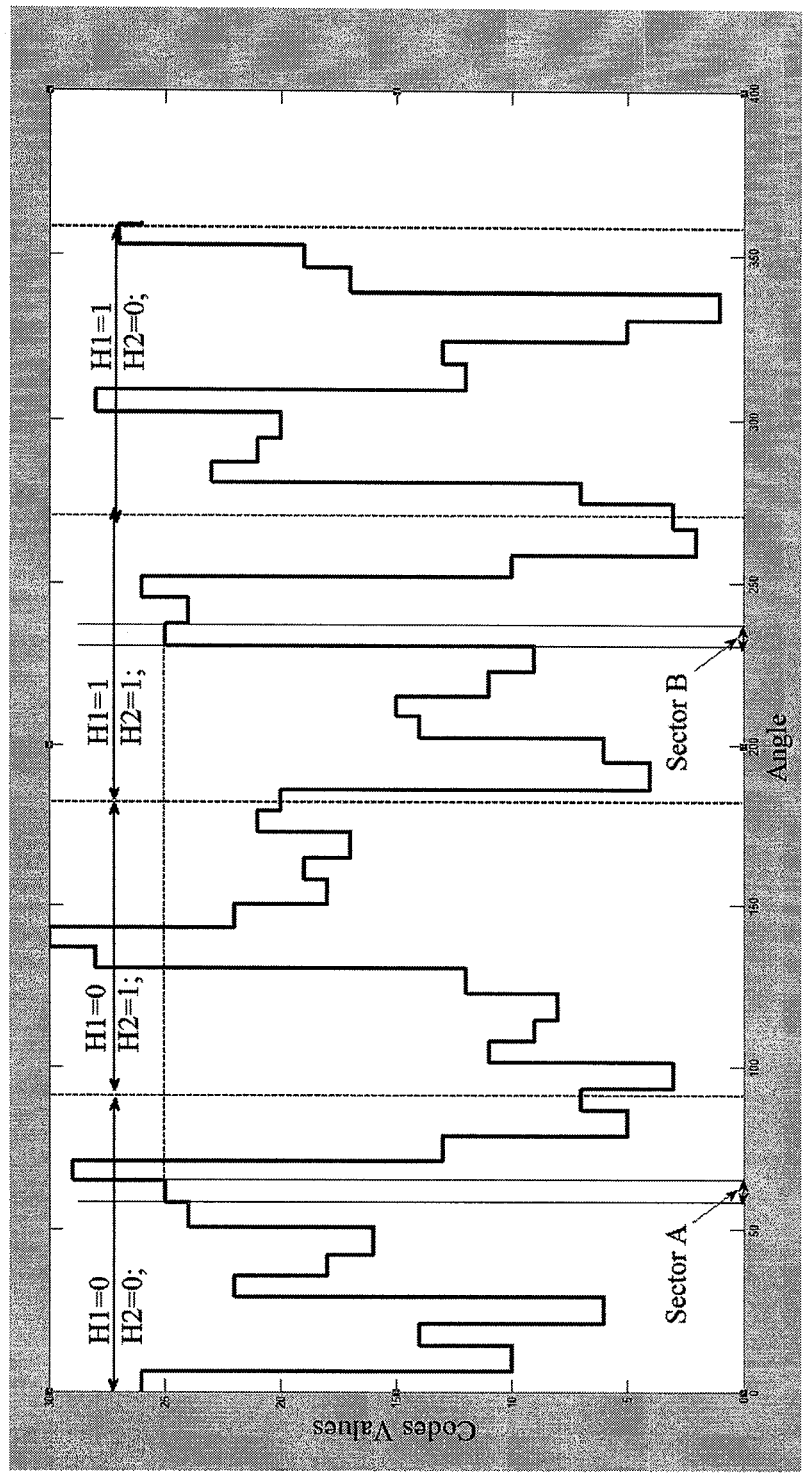
FIG. 4 shows an example of code values obtained with a pattern and 5 sensors where same code value 25, shown as an example, is obtained at two different sectors.

FIG. 4 is a graph showing the code value for each sector. In FIG. 4 there is also shown 4 ranges of positions for which the digital Hall sensors have a given state. These ranges are shown by double arrows labeled with the state of the digital Hall sensors H1 and H2. The combination of the code of a sector, and the state of the digital Hall sensors provides a unique corresponding identifier of the sector with the resolution of a sector size. As an example, in FIG. 4, it can be seen that the same code 25 is obtained for sectors A and B which are sectors $9^{th}$ and $33^{rd}$ when counting sectors from angle 0 of the graph. At sector A, digital Hall sensors have states H1=0 and H2=0, while at sector B digital hall sensors have different states H1=1 and H2=1. The code of a sector combined with the digital Hall sensor's state thus gives a unique corresponding identifier of the sector, and thus gives low resolution position value of the disc rotation angle.

It is of particular advantage that this low resolution position value is obtained with a resolution greater than $2^n$, (32 in this particular case). This increased resolution is obtained requiring neither an increased number of sensors nor miniaturization of the pattern sections.

This is in contrast with U.S. Pat. No. 9,007,057 by Villaret; in this prior art patent, in order to obtain a high resolution, the number of sensors must be increased. This also requires the use of small pattern sections, precisely positioned. According to this prior art patent, the pattern section should have position and length precision better than one half a sector size in order to produce the Gray code. In total, the number of sensors is increased and precision requirements of the pattern are increased, resulting in higher complexity and cost. In particular, if magnets are used for pattern, increasing resolution of the digital code becomes impractical.

In a pre-processing step, for each sector, a least one particular combination of a number of Hall sensor signals is selected and stored in the form of tables in the CPU 107 memory. These tables are referred to as "combination tables". A combination of Hall sensor signals may include any mathematical operation. The purpose of the combination is to obtain a combined signal which is monotonous with the angular position in the range of the sector. A further purpose of this combined signal is to create a signal which is less sensitive to mechanical and electronic tolerance of the particular implementation. Examples of signals combinations are:

A weighted sum of all the signals that are monotonous within the particular sector. For example, weight may be 1 if the signal is growing, or −1 if the signal is decreasing The arc-tangent of the ratio of two signals that are zero crossing at the two sector ends The arc-tangent of the ratio of two combined signals each combined signal being the weighted sum of monotonous signals in the code range.

It must be understood that many other combinations can be used.

Using combination tables, for each sector, identified as explained above, a particular combination of signals is defined. The CPU 107 acquires the low resolution position value and uses it as an entry variable to the combination tables, and calculates the correspondent combined signals.

Figure 5:
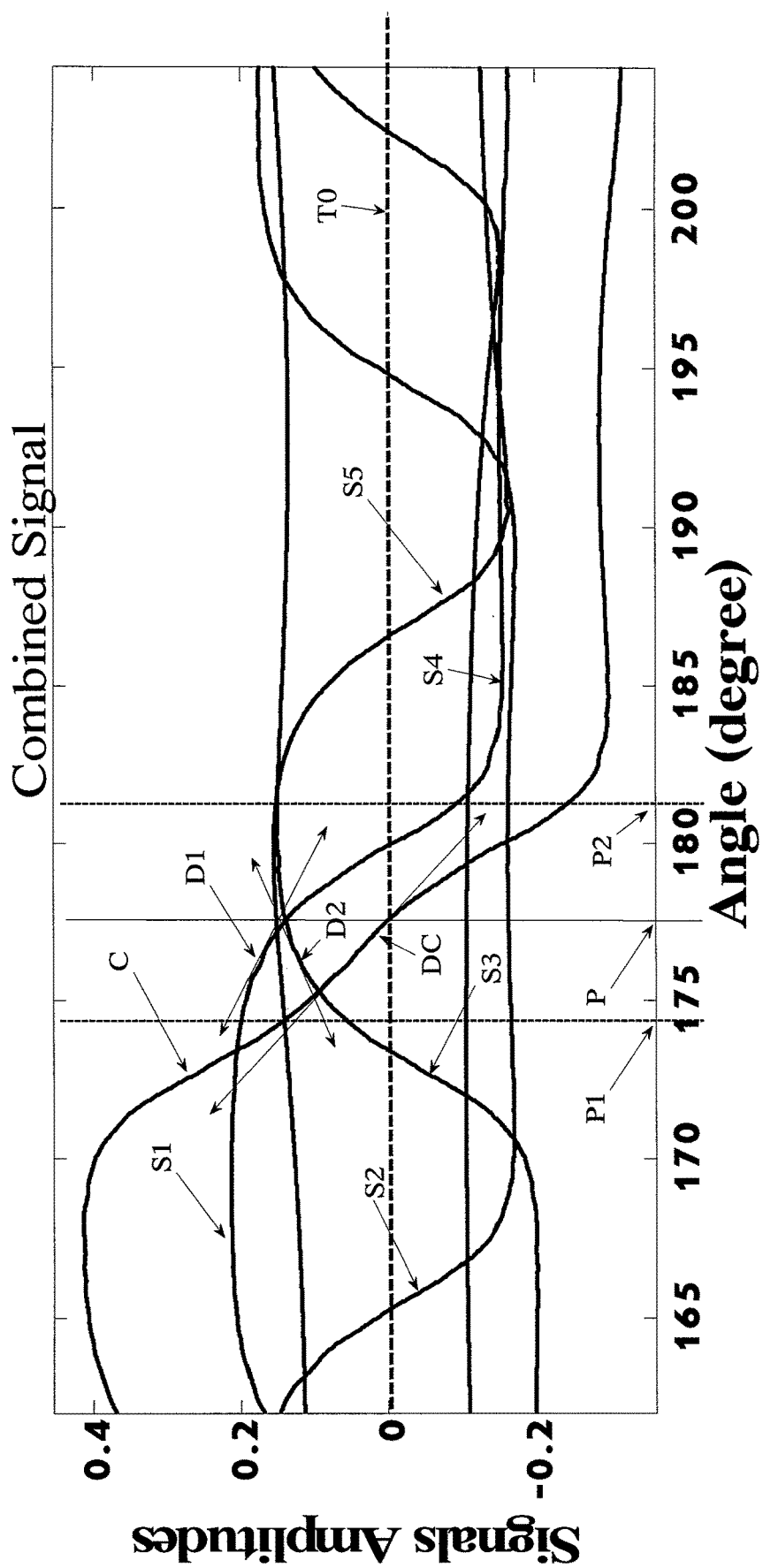
FIG. 5 shows a combined signal at a given angular position.

FIG. 5 shows the variation of the signals S1-S5 (also of FIG. 3) within a short angular position range. At the particular position P, the CPU 107 acquires the low resolution position value, and selects the correspondent combination of signals to be used. In the particular example shown in FIG. 5, the combination is defined by C=S1−S3. The variation of the combined signal C is shown.

During the pre-processing step, for each low resolution position value and in the respective low resolution position range, combined signals values and angular position are stored in position tables, as a function of the combined signal values. Thus for each low resolution position, at least one table is defined. Optionally, a mathematical model that approximates the variations of the combined signal values with position may be found. In this case, these tables will contain the parameters of the mathematical model.

Referring again to the particular case shown in FIG. 5, at position P, the particular position table is defined. This table defines a function of the position P=f(C), where C represents the value of the combined signal, and P the position value. The sector with code 25 is defined between the two zero crossing of signals S3 and S1, occurring respectively at positions P1 and P2. As can be seen, the combined signal C is monotonous over the whole range of the sector. The function can thus be inversed. This inversed function P=f(C) has been recorded in the pre-processing step in a specific position table of high resolution. Alternatively, the signals S3 and S1 could also have been used, since in this sector they are monotonous. At position P there is shown in FIG. 5 the slope of the signals C, S3 and S1 with respective double arrows labeled DC, D3 and D1.

As can be seen, the slope of signals S3 and S1 (D3 and D1) are much smaller than the slope of the combined signal. This means that a small error in reading of signal S3 or S1 would result in a relatively large error of the position reading P. In contrast, the slope of the combined signal is always higher, and thus same error in reading results in a smaller position reading error. For clarity purpose, the combined signal has been shown using two signals. In a practical embodiment, a greater number of signals can be used with various mathematical combinations to reduce the sensitivity to errors in the analog signal value readings.

Figure 6:
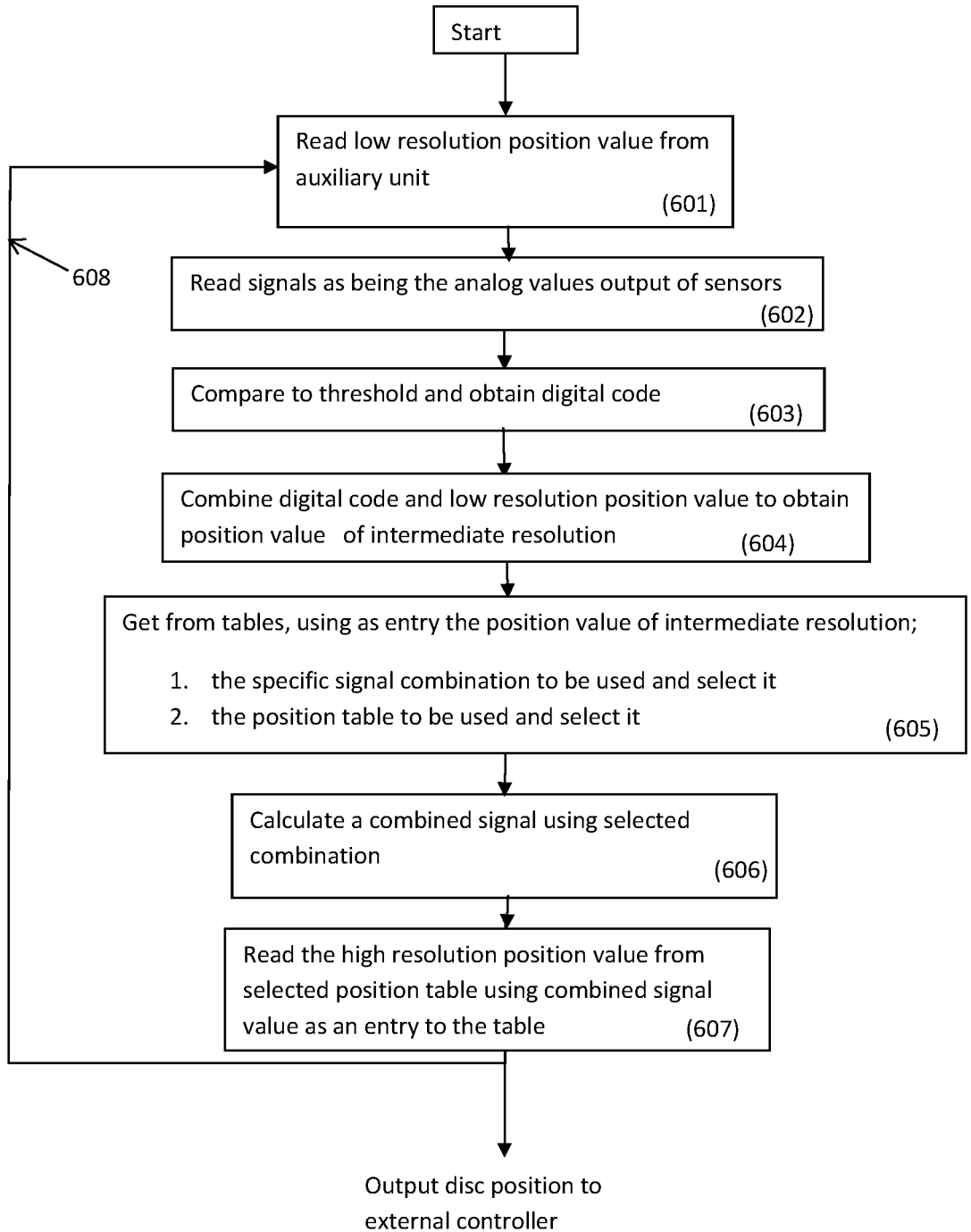
FIG. 6 shows a general block diagram for the processing of the sensor signals to output a high resolution position value.

FIG. 6 is a simplified block diagram of the encoder processing method.

In first block 601, a position value of low resolution is acquired from the auxiliary unit. As an example, in the above-described embodiment, this is achieved by reading the state of the two digital Hall sensors (203*a* and 203*b* of FIG. 3), In block 602, the output of the sensors is read providing analog signals.

In block 603, the said analog signals are compared to a threshold to provide digital values and combined to make a digital word code.

In block 604 the code value combined with the position value of low resolution of the auxiliary unit provides a unique corresponding identifier of a position value of intermediate resolution. The obtained code value may be ambiguous due to the fact that it is characteristic of a number of positions, however the low resolution position value acquired from the auxiliary unit resolves this ambiguity.

Other means of reading the position value of intermediate resolution may be used.

In block 605, the position value of intermediate resolution is used as an entry variable to the tables:

A first table defines the type of mathematical combination to use with the signals.

A second table defines which position table to use.

The defined combination and position tables are then selected.

In block 606 a combined signal is calculated.

In block 607, the position value of high resolution is read from the selected position table, using the combined signal value as an entry variable to the selected position table.

The output of block 607 is thus a high resolution position value output by the encoder.

This process is executed in a continuous cycle 608.

In the above described embodiment, an auxiliary unit is required in order to resolve code ambiguities. The auxiliary unit is preferably of very low resolution in order to reduce its cost.

In order to avoid additional cost of this auxiliary unit, a preferred embodiment will be shown which is able to provide the position information of intermediate resolution by means of further analog signal processing.

Figure 7:
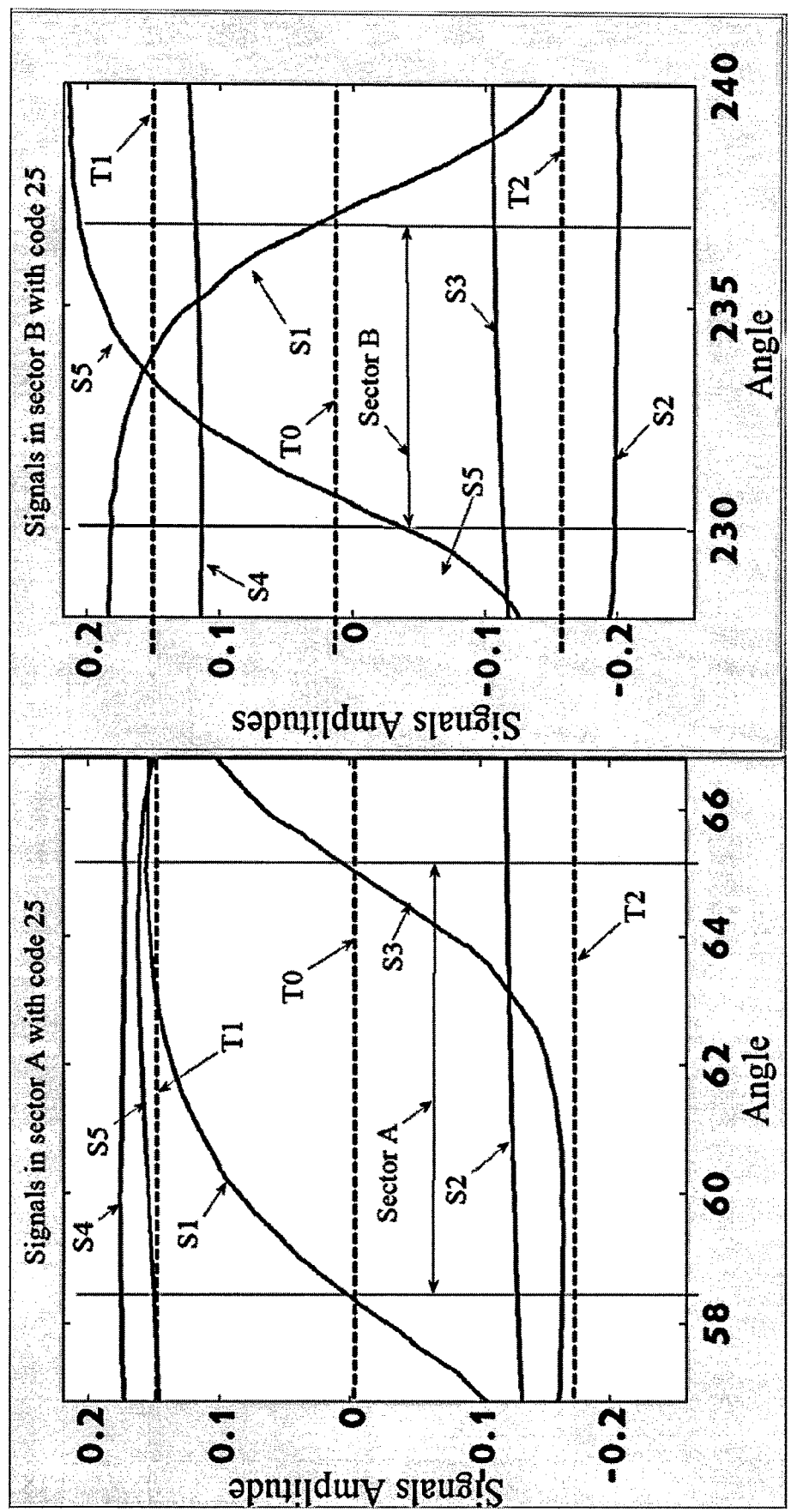
FIG. 7 shows sensor signal variations in the range of two sectors for which the same code is obtained.

In FIG. 7 there are shown the variations of the signals S1-S5 of the embodiment shown in FIG. 2. The signals are the same signal as shown in FIG. 3, and are shown in two graphs around the positions of sectors A and B of FIG. 4. At these two positions, the same digital code 25 is obtained. In the left graph (FIG. 7) around A, it can be seen that signal S4 always has a value greater than a threshold value T1, while in the right graph around B, the signal S4 always has value smaller than threshold value T1. The two sectors can thus be distinguished by comparing the value of the signal S4 to the threshold value T1. In the pre-processing step, the value of the threshold T1, and the number of the signal to be compared to this threshold are recorded and stored in the CPU 107. In case there are several sectors with the same code, then several thresholds and signals like T1 and S4 can be used. For example, for the particular case shown in FIG. 7, two thresholds T1 and T2 can be used respectively with signals S4 and S2.

Finally, it is thus possible to obtain the position value of intermediate resolution by further processing of the analog signals.

Figure 8:
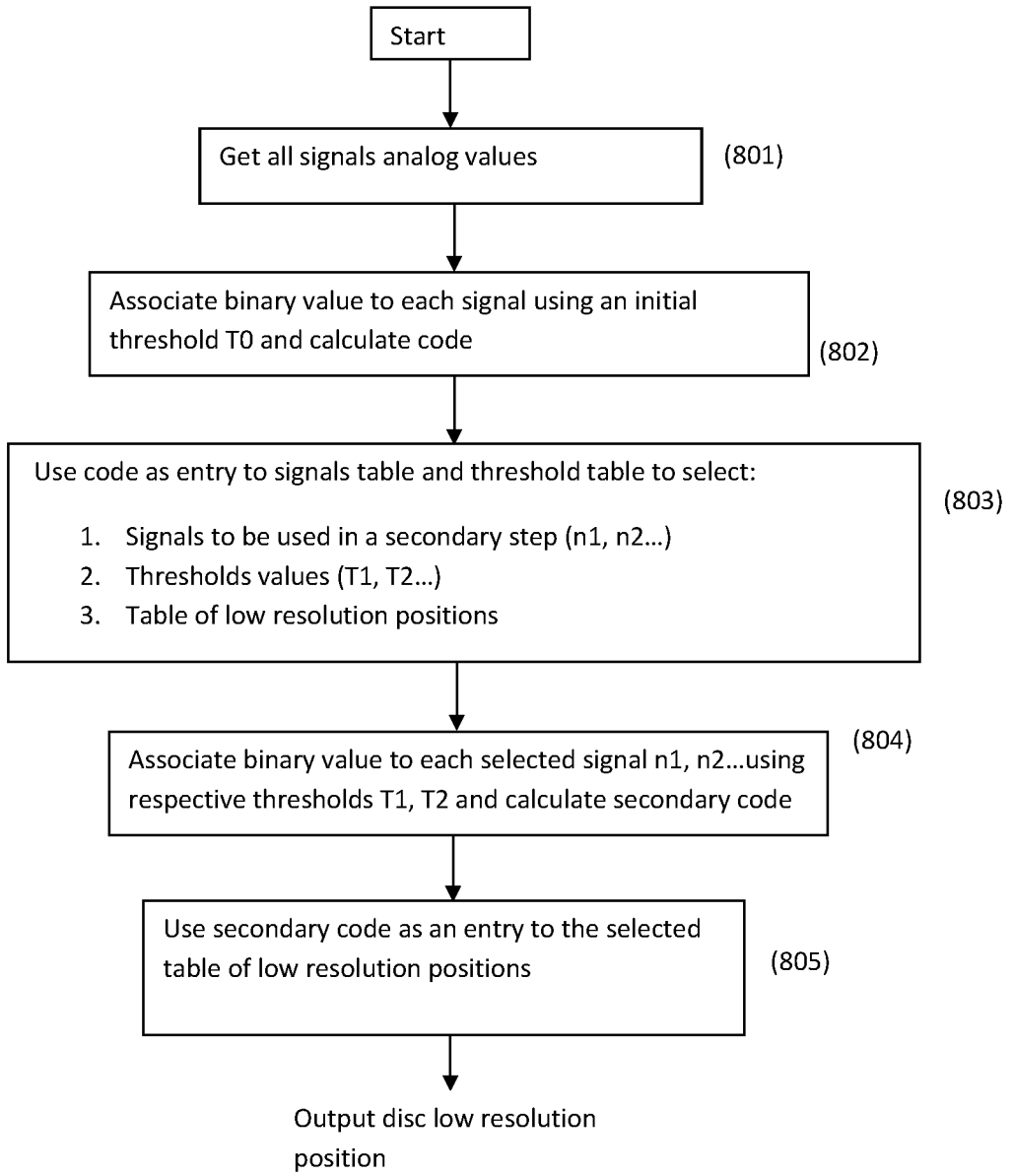
FIG. 8 is a block diagram describing the processing steps for obtaining a low resolution position value.

FIG. 8 shows a block diagram for the processing of the analog signals in order to obtain a position value of intermediate resolution.

In block 801, all analog signals values are acquired.

In block 802, all signal are compared to a threshold T0 to provide a Boolean value and calculate a digital code.

In block 803 the digital code is used as an entry variable to the tables to select:

1—A number of threshold values T1,T2.
2—Signals to be compared to these thresholds (n1, n2 . . . )
3—Table of positions of intermediate resolution.

In block 804 binary values are associated to selected signals (n1, n2 . . . ) by comparing each to the correspondent threshold. These binary values are set in additional bits of the code, thus creating a secondary code.

In block 805, secondary code is used as entry to the selected table of low resolution position, and low resolution position value is obtained.

Many variations can be conceived within the scope of this invention, wherein the use of several thresholds provides a position value of intermediate resolution.

Having described the invention with regard to certain specific embodiments, it is to be understood that the description is not meant as a limitation, since further modifications will now become apparent to those skilled in the art, and it is intended to cover such modifications as fall within the scope of the appended claims.

The invention claimed is:

1. A high resolution encoder device to measure the angular position of a rotating element, comprising:
   a) first means to provide a first angular position value;
   b) a rotating disc fixed to the rotating element, said rotating disc including a circular track having sections associated with a first and second property according to a given pattern,
   c) a number of fixed sensors positioned in proximity of said circular track, each sensor outputting an electrical signal having a first range of analog values when in proximity to said circular track section associated with said first property, and a second range of analog values when in proximity to said circular track section associated with said second property,
   each sensor receiving continuously changing intermediate values when said rotating disc rotates from a position at which said sensor is in proximity to said circular track section associated with said first or second property to a position at which said sensor is in proximity to said circular track section associated with said second or first property respectively,
   d) processing means to process the analog values of said electrical signals; and
   e) a memory to store pre-recorded tables of signal selection, signal combinations and table position values, wherein for every said first angular position value there is selected:
      i) a number of said electrical signals,
      ii) at least one mathematical combination of analog values of said selected electrical signals and
      iii) at least one of said pre-recorded table position values, wherein said selected electrical signal analog values are combined using said selected mathematical combination to provide a combined value, and
      wherein at least one high resolution angular position value of said rotating disc is retrieved from at least one of said selected table position values using said combined analog value as an entry variable.

2. The encoder device of claim 1 wherein said first means to provide a first position value comprises an auxiliary unit providing a low resolution position value and wherein said electrical signal analog values are digitized by comparison to threshold values to provide a digital word code, and wherein said code and low resolution position value taken together are characteristic of said first position value.

3. The encoder device of claim 1 wherein said first means to provide a first position value includes processing steps of:
   a) associating a Boolean value to each electrical signal by comparing it to a first threshold to compose a digital word code;
   b) selecting for said digital word code at least one electric signal, at least one second threshold value and at least one table of said first position values;
   c) obtaining at least one Boolean value by comparing said selected electrical signal analog value to one of said selected second threshold values; and
   d) retrieving said first position value from said selected position value table using said Boolean values as entry variable to said selected table.

4. The encoder device of claim 1 wherein at least one section associated with said first or second properties includes permanent magnets generating a magnetic field, and wherein said sensors output said electrical signal analog values related to said magnetic field.

5. The encoder of claim 2 wherein said auxiliary unit includes two magnetic sensors distanced angularly by approximately one quarter of a turn and at least one magnet fixed to said rotating disc, said magnet inducing variable electrical signals in said magnetic sensors during disc rotation.

6. A method for measuring the angular position of a rotating element, using a high resolution encoder device comprising:
   providing a high resolution encoder device comprising:
   a) first means to provide a first angular position value;
   b) a rotating disc fixed to the rotating element, said rotating disc including a circular track having sections associated with a first and second property according to a given pattern,
   c) a number of fixed sensors positioned in proximity of said circular track, each sensor outputting an electrical signal having a first range of analog values when in proximity to said circular track section associated with said first property, and a second range of analog values when in proximity to said circular track section associated with said second property,
   each sensor receiving continuously changing intermediate values when said rotating disc rotates from a position at which said sensor is in proximity to said circular track section associated with said first or second property to a position at which said sensor is in proximity to said circular track section associated with said second or first property respectively,
   d) processing means to process the analog values of said electrical signals; and
   e) a memory to store pre-recorded tables of signal selection, signal combinations and table position values, and selecting, for every said first angular position value:

i) a number of electrical signals;

ii) at least one mathematical combination of analog values of said selected electrical signals and iii) at least one of said pre-recorded table position values, wherein said selected electrical signal analog values are combined using said selected mathematical combination to provide a combined value, and wherein at least one high resolution angular position value of said rotating disc is retrieved from at least one of said selected table position values using said combined value as an entry variable.

7. The method of claim 6 wherein said first means to provide a first position value comprises an auxiliary unit providing a low resolution position value and wherein said electrical signal analog values are digitized by comparison to threshold values to provide a digital word code, and wherein said code and low resolution position value taken together are characteristic of said first position value.

8. The method of claim 6 wherein said first means to provide a first position value performs the processing steps of:

a) associating a Boolean value to each electrical signal by comparing it to a first threshold to compose a digital word code;

b) selecting for said digital word code at least one electric signal, at least one second threshold value and at least one table of said first position values;

c) obtaining at least one Boolean value by comparing said selected electrical signal analog value to one of said selected second threshold values; and d) retrieving said first position value from said selected position value table using said Boolean values as entry variable to said selected table.

9. The method of claim 6 wherein at least one section associated with said first or second properties includes permanent magnets generating a magnetic field, and wherein said sensors output said electrical signal analog values related to said magnetic field.

10. The method of claim 7 wherein said auxiliary unit includes two magnetic sensors distanced angularly by approximately one quarter of a turn and at least one magnet fixed to said rotating disc, said magnet inducing variable electrical signals in said magnetic sensors during disc rotation.

* * * * *